(12) United States Patent
Wachinger

(10) Patent No.: US 10,232,714 B2
(45) Date of Patent: Mar. 19, 2019

(54) MOTOR VEHICLE OPERATING DEVICE WITH CONTROLLER TO PROVIDE BOUNCE SUPPRESSION FOR ACTUATING ELEMENT

(71) Applicant: AUDI AG, Ingolstadt (DE)

(72) Inventor: Michael Wachinger, Winkelhausen (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 15/741,160

(22) PCT Filed: Apr. 29, 2016

(86) PCT No.: PCT/EP2016/000703
§ 371 (c)(1),
(2) Date: Dec. 29, 2017

(87) PCT Pub. No.: WO2017/001033
PCT Pub. Date: Jan. 5, 2017

(65) Prior Publication Data
US 2018/0194229 A1 Jul. 12, 2018

(30) Foreign Application Priority Data
Jul. 2, 2015 (DE) .................. 10 2015 008 537

(51) Int. Cl.
*G06F 3/033* (2013.01)
*B60K 37/06* (2006.01)
(Continued)

(52) U.S. Cl.
CPC .............. *B60K 37/06* (2013.01); *B60K 35/00* (2013.01); *G06F 3/016* (2013.01); *G06F 3/0338* (2013.01);
(Continued)

(58) Field of Classification Search
CPC ... G06F 2203/014; G06F 3/016; B60K 37/06; H03K 17/9622; H03K 2217/96062
(Continued)

(56) References Cited

U.S. PATENT DOCUMENTS

| 5,790,108 A | * | 8/1998 | Salcudean | ............... G06F 3/016 345/157 |
| 8,942,410 B2 | * | 1/2015 | Wilk | ..................... H04R 9/025 381/388 |

(Continued)

FOREIGN PATENT DOCUMENTS

| CN | 103703432 | 4/2014 |
| CN | 103842938 | 6/2014 |

(Continued)

OTHER PUBLICATIONS

German Office Action dated Jan. 21, 2016 from German Patent Application No. 10 2015 008 537.9, 5 pages.
(Continued)

*Primary Examiner* — Adam J Snyder
(74) *Attorney, Agent, or Firm* — Staas & Halsey LLP

(57) ABSTRACT

An actuating element, actuator device, and a control device are included in an operating device for a motor vehicle. The actuating element detects a user actuation and is movably mounted. The actuator device has an electromagnet and a permanent magnet. The control device applies a first electrical current to the electromagnet, by which the electromagnet applies a first magnetic force to the permanent magnet, which deflects the actuating element out of a rest position. The deflection of the actuating element can be felt as a brief jolt without reverberation. An elastically deformable restoring device presses or pulls the actuating element with a restoring force toward the rest position against a mechanical stop element.

20 Claims, 1 Drawing Sheet

(51) Int. Cl.
*G06F 3/01* (2006.01)
*H03K 17/96* (2006.01)
*B60K 35/00* (2006.01)
*G06F 3/0338* (2013.01)
*G06F 3/038* (2013.01)
*H03K 17/97* (2006.01)
*H03K 17/98* (2006.01)
*G06F 3/0354* (2013.01)

(52) U.S. Cl.
CPC ........ *G06F 3/0383* (2013.01); *G06F 3/03547* (2013.01); *G06F 3/03548* (2013.01); *H03K 17/9622* (2013.01); *H03K 17/97* (2013.01); *H03K 17/98* (2013.01); *B60K 2350/1028* (2013.01); *G06F 2203/014* (2013.01); *H03K 2217/96062* (2013.01)

(58) Field of Classification Search
USPC .......................................................... 345/184
See application file for complete search history.

(56) References Cited

U.S. PATENT DOCUMENTS

| | | | | |
|---|---|---|---|---|
| 2011/0037546 A1* | 2/2011 | Marie | ................. | G06F 3/016 335/230 |
| 2013/0257776 A1* | 10/2013 | Tissot | ................. | G05G 5/06 345/173 |
| 2014/0125471 A1* | 5/2014 | Organ | ................. | G06F 3/016 340/407.2 |
| 2014/0176462 A1* | 6/2014 | Ponziani | ................. | G06F 3/046 345/173 |
| 2015/0109223 A1* | 4/2015 | Kessler | ................. | G06F 3/016 345/173 |
| 2015/0316987 A1* | 11/2015 | Tissot | ................. | B60K 37/06 345/173 |

FOREIGN PATENT DOCUMENTS

| | | |
|---|---|---|
| CN | 103975298 | 8/2014 |
| DE | 10 2007 017 305 A1 | 10/2008 |
| DE | 10 2011 079 863 A1 | 1/2013 |
| DE | 10 2011 089 400 A1 | 6/2013 |
| DE | 10 2013 016 491 A1 | 4/2015 |
| DE | 10 2015 008 537.9 | 7/2015 |
| EP | 0 518 648 A2 | 12/1992 |
| EP | 1 450 247 A1 | 8/2004 |
| WO | PCT/EP2016/000703 | 4/2016 |

OTHER PUBLICATIONS

International Search Report dated Jul. 29, 2016 from International Patent Application No. PCT/EP2016/000703, 2 pages.
Translation of International Preliminary Report on Patentability dated Jan. 4, 2018 from International Patent Application No. PCT/EP2016/000703, 7 pages.
Chinese Office Action dated Jul. 3, 2018 from Chinese Patent Application No. 201680038991.X, 5 pages.
Chinese Office Action dated Nov. 13, 2018, from Chinese Patent Application No. 201680038991.X, with English language translation of summary of Examiner's comments, 9 pages total.

* cited by examiner

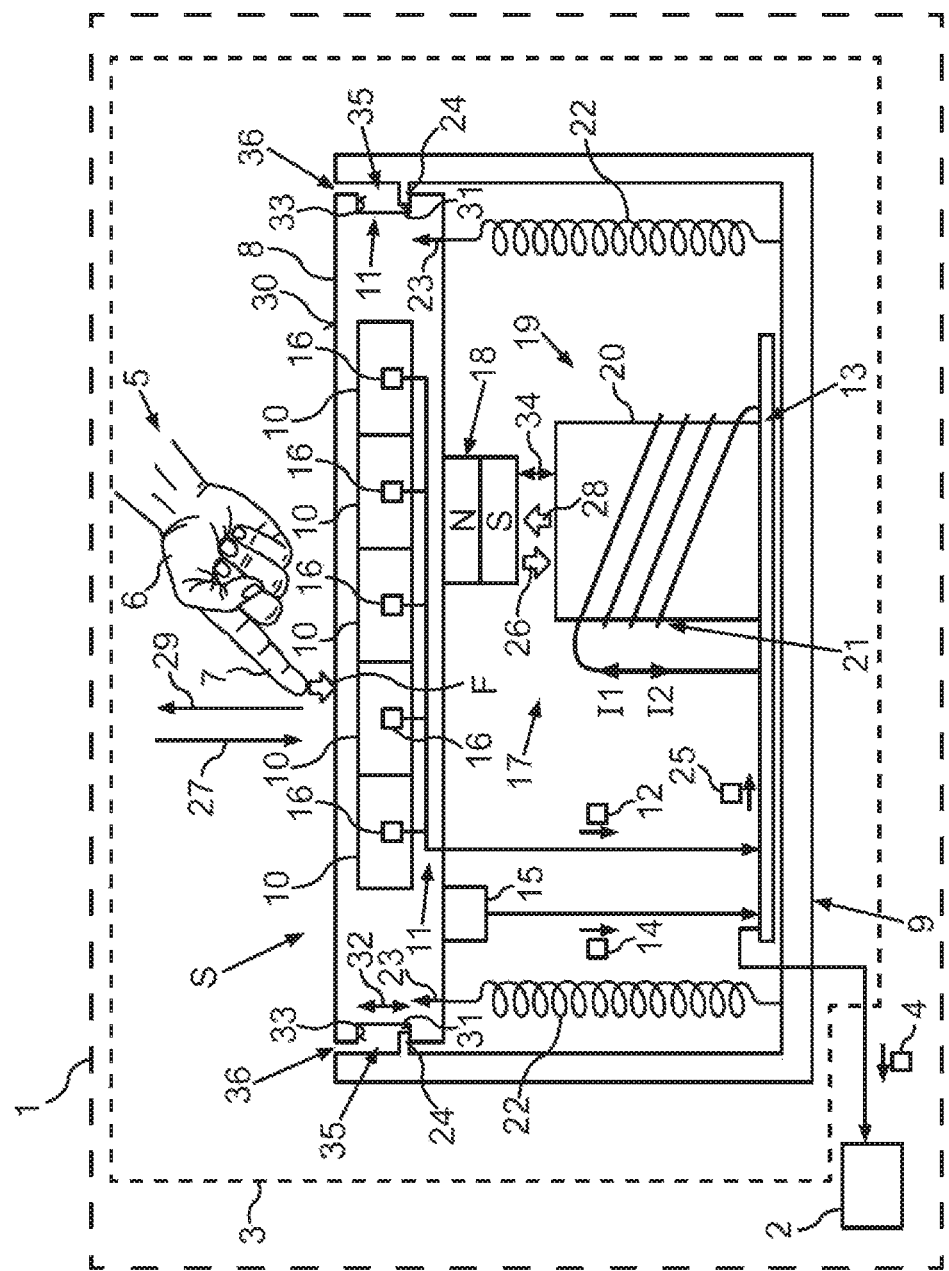

MOTOR VEHICLE OPERATING DEVICE WITH CONTROLLER TO PROVIDE BOUNCE SUPPRESSION FOR ACTUATING ELEMENT

CROSS REFERENCE TO RELATED APPLICATIONS

This application is a U.S. national stage of International Application No. PCT/EP2016/000703, filed on Apr. 29, 2016. The International Application claims the priority benefit of German Application No. 10 2015 008 537.9 filed on Jul. 2, 2015. Both the International Application and the German Application are incorporated by reference herein in their entirety.

BACKGROUND

Described herein is an operating device for a motor vehicle, by which at least one unit of the motor vehicle can be operated by a user. For this purpose, the operating device has an actuating element for detecting a user actuation. The actuating element may be for example a button. Also provided is an actuator device, by which the actuating element can be moved, the actuator device having for this purpose an electromagnet and a permanent magnet. Finally provided is a control device, which in dependence on an actuating signal applies a current to the electromagnet, in order in this way to move the actuating element out of a rest position. Also described herein is a motor vehicle with the operating device and also a method for operating an operating device.

An operating device is described in U.S. Patent Application Publication No. 2011/0037546 A1. This operating device has as an actuating element a plate, which is mounted on two actuator devices that each have permanent magnets and an electrical coil as an electromagnet. With the actuator device, the plate can be moved out of a rest position. The plate is kept in the rest position because it is clamped between two elastic regions, a sealing region and a supporting region.

A disadvantage of the known operating device is that, after being deflected by the actuator device, the plate tends to oscillate around the rest position after the actuator device has been deactivated. The reason for this is the resilient mounting of the plate between the elastic elements. As a result, the haptic feedback that can be felt by the user when actuating the plate is perceived as an imprecise or spongy or slowly decaying vibration.

By contrast, what would be desirable is an operating device in which an actuating element, for example a button, performs a one-off movement for a limited time that can be clearly perceived by a user, for example a clicking movement or a shudder or a jump.

German Patent Application No. 10 2011 089 400 A1 describes an operating device for a motor vehicle in which a movement of an actuating element is decelerated by a magnetic fluid, the viscosity of the fluid being controllable by an external magnetic field. In this case, the movement is inhibited by a permanent magnet and the actuating element becomes movable by eliminating the magnetic field of the permanent magnet by an electromagnet.

German Patent Application No. 10 2011 079 863 A1 describes a turn-and-press adjuster, the spatial deflection of which as the result of a user actuation is detected by a permanent magnet being arranged on the turn-and-press adjuster and by Hall sensors of a printed circuit board arranged alongside the adjuster detecting a change in the magnetic field of the permanent magnet.

An aspect of the disclosure is based on producing haptic feedback for a user of a clearly defined time or clearly limited time in the case of an operating device of a motor vehicle.

SUMMARY

Described herein is an operating device for a motor vehicle. The operating device has in the way described an actuating element, which is provided for detecting a user actuation. The actuating element may be designed, for example, as a button. The actuating element is movably mounted with respect to a housing of the operating device. Provided for producing haptic feedback is an actuator device, which has an electromagnet as a first magnet element and a permanent magnet as a second magnet element, one of the two magnet elements being fixedly mounted with respect to the actuating element and the other of the two magnet elements being fixedly mounted with respect to the housing. A control device is set up in such a way that, in dependence on a predetermined actuating signal, it applies a first electrical current to the electromagnet, by which the electromagnet applies a first magnetic force to the permanent magnet, which deflects the actuating element out of a rest position. The control device may be realized for example on the basis of a microcontroller or a processor device. The actuating element may be produced for example in dependence on an actuation of the actuating element. By applying the first current to the electromagnet, the actuating element is therefore actively moved by the actuator device. The user feels this as haptic feedback.

In order then to clearly define this haptic feedback, a mechanical stop element is provided and a restoring device of an elastically deformable configuration presses the actuating element against the stop element into the rest position. The operating device may also have a number of stop elements. From now on, reference is only made to one stop element, since the operating device can in principle be realized with a single stop element. The restoring device may be configured for example as a spring, for example a spiral spring or leaf spring. The restoring device permanently applies a restoring force to the actuating element, which presses the actuating element into the rest position. The restoring element may also be arranged in such a way that it pulls the actuating element into the rest position. The stop element may be for example a web or a projection on the housing. The stop element is made in particular of a rigid, i.e. inelastic, material, for example of a plastic or metal. This suppresses reverberation.

The operating device described herein provides the advantage that, after deactivating the first current, that is to say when the actuator device is no longer producing a magnetic force between the permanent magnet and the electromagnet, the deflected actuating element is pressed or pulled against the stop element by the restoring device because of the restoring force. As soon as the stop element is reached, that is to say the actuating element comes into contact with the stop element in the rest position, the deflection, that is to say the movement of the actuating element, is ended. There cannot be any oscillation about the rest position. Consequently, the haptic feedback ends abruptly and/or distinctly and/or with the stop element being contacted by the actuating element. The deflecting of the actuating element out of the rest position by using the actuator device and the subsequent moving back of the actuating element against the stop element is perceived by the user as clicking, that is to say for example as the clicking of a button.

The operating device described herein also includes developments, the features of which provide additional advantages.

According to one development, the control device is set up in such a way that, after the first current, that is to say after the first current has been applied to the electromagnet, it applies a second current to the electromagnet, by which the electromagnet applies a second magnetic force opposite to the first magnetic force to the permanent magnet. For example, the polarity of the current is reversed in order to switch over from the first current to the second current. By applying the second magnetic force to the permanent magnet, the deflected actuating element is pressed or pulled back into the rest position against the stop element. In other words, the restoring device is assisted by the electromagnet in moving the actuating element back into the rest position and, when in that position, pressing or pulling it against the stop element. As a result, a one-off deflection that can be clearly felt by the user, that is to say a jolt or a shudder, can be caused or produced in the actuating element.

According to one development, the control device is designed here for the purpose that it produces the second current within a predetermined time period after the beginning of the deflecting of the actuating element out of the rest position. In other words, the deflection lasts for a predetermined time period from when the deflecting begins, that is to say from the beginning of the movement out of the rest position. This time period may be less than 200 ms. As a result, a distinct mechanical clicking is obtained, which the user can for example feel with the finger on the actuating element. Another term for this is also the snap action effect.

One development provides that the control device is designed for the purpose that it keeps the actuating element in the rest position for a predetermined time period by the second magnetic force. The time period may for example lie in a range from 10 ms to 500 ms. This development advantageously provides bounce suppression. In other words, the actuating element is prevented from bouncing off the stop element and again performing a bouncing movement that can be felt by the user.

According to one development, the actuating element does not just have a single button, but a number of button areas. In other words, a number of buttons that can be distinguished from one another are provided on the actuating element. A button area may be formed for example by a button top or a dummy button that is fastened to the actuating element. The sensor device for detecting the user actuation is designed to detect which of the buttons a user touches. For this purpose, a capacitive sensor or a microswitch may be provided for example in the button area. This development provides the advantage that the described haptic feedback is realized for a number of buttons or button areas by a single actuator device (permanent magnet and electromagnet). Serving then to distinguish which of the button areas has been operated or pressed or touched by the user during the user actuation is the described sensor device, which can in particular be provided with far less expenditure in technical terms than a dedicated actuator device for each button.

According to one development, a force sensor is provided, generating a force signal that correlates with an operating force which is applied to the actuating element by the user actuation. The force sensor may be formed for example on the basis of an electrical resistor, the resistance value of which changes in dependence on the operating force. The control device is in this case set up in such a way that it generates the actuating signal if the force signal signals an operating force greater than a predetermined threshold value. The threshold value may for example lie in a range between two newtons and six newtons. This development provides the advantage that the described deflection of the actuating element by the actuator device is not already caused by the actuating element being touched or approached a single time. Rather, the user must first apply at least the operating force, which is greater than the threshold value, in order that a user actuation is also actually registered or detected. As a result, inadvertent actuation of the operating device is effectively avoided.

According to one development, the control device is set up in such a way that it modulates a variation of the current intensity over time of the first current and/or of the second current with a predetermined haptics signal. In other words, during the deflecting movement of the actuating element out of the rest position and back into the rest position, the actuating element is impressed with an additional movement signal, which is determined by the haptics signal. For example, a vibration is modulated on. This provides the advantage that different haptic signals are sent to the user by using different haptics signals.

As already stated, also described herein is a motor vehicle. In the case of the motor vehicle described herein, at least one unit of the motor vehicle is coupled to an operating device, which represents an embodiment of the operating device described herein. The at least one unit may be for example an infotainment system (information/entertainment system) and/or an air-conditioning system and/or suspension control and/or a telematics system. The operating device is designed to send a control signal to the at least one unit in dependence on a user actuation on the operating device. As a result, a user can therefore operate the at least one unit by using the operating device by actuating the operating device (user actuation). The user actuation is carried out here on the actuating element in the way described. The actuating signal for triggering the haptic feedback can in this case be generated in dependence on a signal of a sensor device and/or a pressure sensor. In a way known per se, a control signal by which at least one unit of the motor vehicle is controlled can be generated together with the actuating signal. The actuating signal is also transmitted to the operating device as an external signal.

The motor vehicle described herein, may be for example, configured as a motor car, in particular as a passenger car.

Finally, also described herein is a method for operating an operating device. The method is based on an actuating element, which is movably mounted with respect to a housing of the operating device. In the unactuated state, the actuating element has a rest position, in which it is arrested by a mechanical stop element. Here, the actuating element may be pressed or pulled against the stop element by a restoring device.

The actuating element is moved by a user actuation, in that the user for example touches or presses the actuating element. A detection of the user actuation may take place for example on the basis of the sensor device described (for example, a capacitive sensor, microswitch, etc.). In dependence on a predetermined actuating signal, a control device applies a first magnetic force to a permanent magnet of an actuator device by using an electromagnet of the actuator device. This takes place in the way described. The actuating signal may be generated for example in dependence on the sensor signal of the sensor device described when the user actuation is detected. The first magnetic force deflects the actuating element out of the rest position in the way described, i.e. the actuating element performs a deflecting movement. In order then to turn this active deflection into haptic feedback at a distinct time or of a clearly defined time, it is provided in the case of the methods described herein that, after producing the first magnetic force, a second magnetic force opposite to the first magnetic force is subsequently applied to the permanent magnet by using the electromagnet, with the effect of pressing or pulling the actuating element against the stop element into the rest position. By striking the stop element, the actuating element ends its deflecting movement all of a sudden or with a jolt, so that the deflection is ended abruptly. In particular, oscillation of the actuating element about the rest position is avoided.

Developments of the method that have features which have already been described in connection with the developments of the operating device described herein are also applicable. For this reason, the corresponding developments of the method are not repeated again here.

BRIEF DESCRIPTION OF THE DRAWINGS

These and other aspects and advantages will become more apparent and more readily appreciated from the following description of the exemplary embodiments, taken in conjunction with the accompanying drawing of which:

An exemplary embodiment in the single drawing is a schematic representation of an embodiment of a motor vehicle including an operating device.

DETAILED DESCRIPTION OF THE PREFERRED EMBODIMENT

Reference will now be made in detail to preferred embodiments, examples of which are illustrated in the accompanying drawing, wherein like reference numerals refer to like elements throughout.

Exemplary embodiments are explained below with reference to the single drawing. In the exemplary embodiments, the described components of the embodiments each constitute individual features which are to be considered independently of one another and which each also develop the disclosure independently of one another, and therefore are also to be considered individually or in a combination other than that shown. Furthermore, the described embodiments can also be supplemented by further features from among those which have already been described.

The single drawing shows a motor vehicle 1, which is for example a motor car, in particular a passenger car. Depicted are a unit 2 and an operating device 3 for the unit 2. The operating device 3 is coupled to the unit 2, for example by way of a CAN bus (CAN—Controller Area Network). The unit 2 may be for example an infotainment system, an air-conditioning system, a telephone system or suspension control. The operating device 3 may also be coupled to a number of units. For controlling the unit 2, the operating device 3 generates a control signal 4 in dependence on a user actuation of the operating device 3 by a user 5, of which only a hand 6 with a finger 7 is depicted in the drawing. For actuating the operating device 3, the operating device has an actuating element 8, which is movably arranged in a housing 9 of the operating device 3. Arranged on the actuating element 8 is/are a button area or a number of button areas 10, of which the user 5 presses a button area 10 with the finger 7. A sensor device 11 detects which button area 10 the user 5 has touched or pressed and signals the actuated or operated button area 10 by a sensor signal 12. For detecting when the user 5 touches or approaches one of the button areas 10, the sensor device 11 has for each of the button areas 10 a sensor 16, which may for example be a capacitive proximity sensor.

In dependence on the sensor signal 12, a control device 13 generates the control signal 4. The control device 13 may be formed for example on the basis of a printed circuit board, by which an electronic circuit is realized. It may additionally be provided that the control device 13 receives a force signal 14 of the force sensor 15, by which it is signaled with which operating force F or actuating force the user 5 is pressing the actuating element 8 for example with the finger 7. It may be provided that the control signal 4 is only generated by the control device 13 if, according to the force signal 14, the operating force F is greater than a predetermined threshold value. The force sensor 15 may be formed for example on the basis of a force-variable resistor or have a leaf spring, which closes or opens a contact when there is an operating force F greater than the threshold value.

When operating one of the button areas 10, the user feels haptic feedback with the finger 7. The user feels here that the button area 10 is performing a clicking movement, which is performed at a distinct time and with a displacement that can be clearly felt.

For this purpose, the operating device 3 has an actuator device 17, which includes a permanent magnet 18 and an electromagnet 19. The electromagnet 19 may be formed for example on the basis of a magnetically soft iron core 20 and an electrical coil 21. The electromagnet 19 may also be provided without the iron core 20. In particular, the electrical coil 21 may also be formed by conductor tracks of the printed circuit board of the control device 13, that is to say configured as a flat coil.

In the example shown, the permanent magnet 18 is fastened to the actuating element 8. In the example shown, the electromagnet 19 is for example fixedly connected to the housing 9 by way of the control device 13. The positions may also be changed over, so that the electromagnet 19 is fixedly connected to the actuating element 8 and the permanent magnet 18 is fixedly connected to the housing 9.

The operating device 3 also has a restoring device 22, which applies a restoring force 23 to the actuating element 8, by which it keeps the actuating element 8 in a rest position S if the electromagnet 19 is inactive, that is to say is deenergized or switched off. The rest position S is defined by a stop element 24, against which the actuating element 8 is pressed by the restoring device 22. In the example shown in the drawing, two stop elements 24 are depicted. In the explanation that follows, reference is made to a single stop element 34, and in this connection reference is also made to other multiply provided elements in the singular because their function is identical in each case.

The restoring device 22 may for example have one or more spiral springs, as depicted in the drawing. The stop element 24 may be formed for example by a bar or a cam or a web. The stop element 24 is made, for example, of a rigid, non-resilient material. The actuating element 8 may be produced for example from a plastic, whereby it is particularly lightweight, and can therefore be moved with less electrical power of the electromagnet 19.

Along with generating the control signal 4, the control device 13 generates an actuating signal 25, with the effect of triggering the haptic feedback, by which it is signaled to the user 5 at the finger 7 that he has successfully actuated the button area 10. In dependence on the actuating signal 25, a first current I1 is applied to the electromagnet 19, that is to say the coil 21 is energized by or connected to the first current I1. As a result, the permanent magnet 18 produces a magnetic force of attraction 26 on the permanent magnet 18.

As a result, the permanent magnet 18 is attracted by the electromagnet 19 and with it the actuating element 8 is moved in a deflecting direction 27 out of the rest position S. Subsequently, a second current I2 is applied to the electromagnet 19 by the control device 13 or it is energized. As a result, the electromagnet 19 generates a force of repulsion 28 on the permanent magnet 18. As a result, the actuating element 8 is moved by the force of repulsion 28 in addition to the restoring force 23 back into the rest position S. In other words, the return movement 29 into the rest position S takes place.

Consequently, with the operating device 3, the actuating element 8 is actively excited or moved or accelerated in two opposite directions. As a result, bidirectional active haptics or actorics by the actuator device 17 is obtained. This allows an operator interface 30 that is touched by the user 5 to be actively accelerated and distinctly decelerated again, that is to say in particular brought to a standstill. In this way, undesired reverberation is avoided. Combining the permanent magnet 19 with a permanent magnet 18 makes it possible to operate the actuator device 17 with periodic current reversal, that is to say to reverse the direction of the current in order to decelerate again the user interface 30 that has been accelerated.

Various activating pulses are possible here by modulating the first current I1 and the second current I2. In particular, here the operator interface 30 is movable in two directions, to be specific out of the rest position S and actively back to the rest position S.

The operator interface 30, that is to say the actuating element 8, is in this case first pressed by the restoring device 22 into the neutral position or rest position S. Also fastened to the actuating element 8 in the example is the permanent magnet 18, for example on a rear side of the actuating element 8 that is opposite from the operator interface 30. The permanent magnet 18 is arranged opposite the electromagnet 19. The electromagnet 19 is connected to the housing 9 and is activated by control electronics of the control device 13. If the electromagnet is then activated, it can deflect and/or accelerate the actuating element 8 and then, by changing the direction of the current, be pressed again into the rest position S by the second current I2, due to the resultant changing of the magnetic field (periodic current reversal). The user 5 perceives distinct and/or extremely good haptics when the actuating element 8 is actuated, that is to say when one of the button areas 10 is actuated. Undesired subsequent oscillation of the interface can be counteracted in this way.

In the rest position S, the actuating element 8 lies for example against an abutting surface 31 of the actuating element 8 on the stop element 24. A displacing or deflecting path 32 of the actuating element 8 during the deflecting movement 27 and the restoring movement 29 can be limited by a second abutting surface 33. In particular, the deflecting path 32 is smaller than a distance 34 from the permanent magnet 18 to the electromagnet 19. As a result, sticking of the permanent magnet 18 to the electromagnet 19 is avoided. The two abutting surfaces 31, 33 may be formed by an undercut 35 in the actuating element 8. This provides the advantage that a size of a gap 36 between the actuating element 8 and the housing 9 can be set to be particularly small, in particular less than 1 millimeter. The gap 36 is the visible gap that can be seen by the user 5 from the passenger compartment of the motor vehicle. A small size of the gap 36 also prevents objects from being able to fall into the housing 9.

Altogether, the example embodiments show how an operating element with active haptics and periodic current reversal at the actuator can be provided.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV,* 358 F3d 870, 69 USPQ2d 1865 (Fed. Cir. 2004).

The invention claimed is:

1. An operating device for a motor vehicle, comprising:
a housing;
an actuating element movably mounted with respect to the housing;
an actuator device including an electromagnet as a first magnet element and a permanent magnet as a second magnet element, one of the first and second magnet elements being fixedly mounted with respect to the actuating element and the other of the first and second magnet elements being fixedly mounted with respect to a bottom portion of the housing;
at least one mechanical stop element disposed below an upper surface of the actuating element;
an elastically deformable restoring device configured to press the actuating element to a rest position with a restoring force such that the actuating element is pressed against a lower surface of the at least one mechanical stop element, the lower surface of the at least one mechanical stop element facing toward the bottom portion of the housing; and
a controller configured to:
in dependence on a predetermined actuating signal, apply a first electrical current to the electromagnet, by which the electromagnet applies a first magnetic force to the permanent magnet, to deflect the actuating element out of the rest position,
after the first electrical current is applied, apply a second electrical current to the electromagnet, by which the electromagnet applies a second magnetic force opposite to the first magnetic force to the permanent magnet, to thereby move the deflected actuating element back into the rest position against the lower surface of the at least one mechanical stop element while the elastically deformable restoring device presses the actuating element to the rest position with the restoring force, and
to maintain the actuating element in the rest position for a predetermined time period via application of the second magnetic force to thereby provide for bounce suppression to prevent the actuating element from bouncing off the at least one mechanical stop element and again performing a bouncing movement that can be felt by a user.

2. The operating device as claimed in claim 1, wherein the controller is further configured to apply the second electrical current within a predefined time period after beginning the deflecting of the actuating element out of the rest position.

3. The operating device as claimed in claim 2, wherein the predefined time period is less than 200 milliseconds.

4. The operating device as claimed in claim 1, wherein the actuating element includes button areas and a sensor device to detect which of the button areas the user actuates.

5. The operating device as claimed in claim 1, further comprising a force sensor to generate a force signal that correlates with an operating force applied to the actuating element during actuation of the actuating element by the user, and
 wherein the controller is configured to generate the predetermined actuating signal if the force signal indicates the operating force is greater than a predetermined threshold value.

6. The operating device as claimed in claim 1, wherein the controller is configured to modulate a variation of current intensity over time of at least one of the first electrical current and the second electrical current with a predetermined haptics signal.

7. The operating device as claimed in claim 1, wherein a deflection distance the actuating element travels when the actuating element is fully deflected out of the rest position by the first magnetic force is less than a separation distance between the electromagnet and the permanent magnet.

8. The operating device as claimed in claim 1, wherein
 the at least one mechanical stop element is made of a rigid material and protrudes from an inner surface of the housing,
 the lower surface of the at least one mechanical stop element is in contact with a first abutting surface of the actuating element when the actuating element is in the rest position, and
 the first abutting surface is disposed below the upper surface of the actuating element.

9. The operating device as claimed in claim 8, wherein
 the actuating element includes a second abutting surface which contacts an upper surface of the at least one mechanical stop element when the actuating element is fully deflected out of the rest position by the first magnetic force,
 the first abutting surface faces away from the bottom portion of the housing, and toward the second abutting surface, and
 the second abutting surface faces toward the bottom portion of the housing.

10. The operating device as claimed in claim 1, further comprising a force sensor to generate a force signal that correlates with an operating force applied to the actuating element during actuation of the actuating element by the user, and
 wherein the controller is configured to generate the predetermined actuating signal if the force signal indicates the operating force is greater than a predetermined threshold value, and to generate a control signal to control a vehicle system of the motor vehicle if the force signal indicates the operating force is greater than the predetermined threshold value.

11. The operating device as claimed in claim 1, wherein
 the first magnet element including the electromagnet is fixed to the housing,
 the second magnet element including the permanent magnet is fixed to the actuating element, and
 when the controller applies the first electrical current to the electromagnet, the first magnetic force is applied to the permanent magnet thereby causing the actuating element to be deflected out of the rest position, and the actuating element and the permanent magnet are moved toward the electromagnet.

12. A motor vehicle, comprising:
 a chassis;
 at least one vehicle system; and
 an operating device coupled to the at least one vehicle system, configured to transmit a control signal to the at least one vehicle system based on a user actuation on the operating device, the operating device including:
  a housing,
  an actuating element movably mounted with respect to the housing,
  an actuator device including an electromagnet as a first magnet element and a permanent magnet as a second magnet element, one of the first and second magnet elements being fixedly mounted with respect to the actuating element and the other of the first and second magnet elements being fixedly mounted with respect to a bottom portion of the housing,
  at least one mechanical stop element disposed below an upper surface of the actuating element,
  an elastically deformable restoring device configured to press the actuating element to a rest position with a restoring force such that the actuating element is pressed against a lower surface of the at least one mechanical stop element, the lower surface of the at least one mechanical stop element facing toward the bottom portion of the housing, and
  a controller configured to:
   in dependence on a predetermined actuating signal, apply a first electrical current to the electromagnet, by which the electromagnet applies a first magnetic force to the permanent magnet, to deflect the actuating element out of the rest position,
   after the first electrical current is applied, apply a second electrical current to the electromagnet, by which the electromagnet applies a second magnetic force opposite to the first magnetic force to the permanent magnet, to thereby move the deflected actuating element back into the rest position against the lower surface of the at least one mechanical stop element while the elastically deformable restoring device presses the actuating element to the rest position with the restoring force, and
   to maintain the actuating element in the rest position for a predetermined time period via application of the second magnetic force to thereby provide for bounce suppression to prevent the actuating element from bouncing off the at least one mechanical stop element and again performing a bouncing movement that can be felt by a user.

13. The motor vehicle as claimed in claim 12, wherein the controller is further configured to apply the second electrical current within a predefined time period after beginning the deflecting of the actuating element out of the rest position.

14. The motor vehicle as claimed in claim 12, wherein the predetermined time period the actuating element is maintained in the rest position is from 10 ms to 500 ms.

15. The motor vehicle as claimed in claim 12, wherein
 the operating device further includes a force sensor to generate a force signal that correlates with an operating force applied to the actuating element during actuation of the actuating element by the user, and
 the controller is configured to generate the predetermined actuating signal if the force signal indicates the operating force is greater than a predetermined threshold value, and to generate a control signal to control a vehicle system of the motor vehicle if the force signal indicates the operating force is greater than the predetermined threshold value.

16. The motor vehicle as claimed in claim 15, wherein the predetermined threshold value is between two newtons and six newtons.

17. The motor vehicle as claimed in claim 12, wherein the at least one vehicle system includes at least one of an infotainment system, an air-conditioning system, a suspension control system, and a telematics system.

18. A method for operating an operating device which includes an actuating element movably mounted with respect to a housing of the operating device, an actuator device having a permanent magnet and an electromagnet, an elastically deformable restoring device, and a controller, the method comprising:

detecting user actuation of the actuating element;

in dependence on a predetermined actuating signal, applying, by the controller, a first magnetic force to the permanent magnet by the electromagnet, thereby deflecting the actuating element out of a rest position that is fixed by a lower surface of at least one mechanical stop element disposed below an upper surface of the actuating element, the lower surface of the at least one mechanical stop element facing toward a bottom portion of the housing to which one of the permanent magnet and the electromagnet are fixedly mounted with respect to;

subsequent to application of the first magnetic force, applying a second magnetic force opposite to the first magnetic force to the permanent magnet by the electromagnet, thereby moving the actuating element deflected out of the rest position back into the rest position against the lower surface of the at least one mechanical stop element while the elastically deformable restoring device presses the actuating element to the rest position with a restoring force; and maintaining the actuating element in the rest position for a predetermined time period via application of the second magnetic force to thereby provide bounce suppression which prevents the actuating element from bouncing off the at least one mechanical stop element and again performing a bouncing movement that can be felt by the user.

19. The method as claimed in claim 18, further comprising:

applying a first electric current to the electromagnet to generate the first magnetic force applied by the electromagnet to the permanent magnet; and applying a second electric current to the electromagnet to generate the second magnetic force within a predefined time period after beginning the deflecting of the actuating element out of the rest position.

20. The method as claimed in claim 18, further comprising:

generating a force signal that correlates with an operating force applied to the actuating element during user actuation of the actuating element by the user;

generating the predetermined actuating signal if the force signal indicates the operating force is greater than a predetermined threshold value; and generating a control signal to control a vehicle system of the motor vehicle if the force signal indicates the operating force is greater than the predetermined threshold value.

* * * * *